（12） United States Patent
Choi

(10) Patent No.: US 11,972,816 B2
(45) Date of Patent: Apr. 30, 2024

(54) SEMICONDUCTOR MEMORY APPARATUS AND OPERATING METHOD THEREOF

(71) Applicant: SK hynix Inc., Icheon-si (KR)

(72) Inventor: Hyung Jin Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 104 days.

(21) Appl. No.: 17/745,632

(22) Filed: May 16, 2022

(65) Prior Publication Data

US 2023/0290420 A1 Sep. 14, 2023

(30) Foreign Application Priority Data

Mar. 8, 2022 (KR) .................. 10-2022-0029342

(51) Int. Cl.
G11C 16/34 (2006.01)
G11C 16/04 (2006.01)
G11C 16/10 (2006.01)
G11C 16/26 (2006.01)

(52) U.S. Cl.
CPC ...... *G11C 16/3459* (2013.01); *G11C 16/0483* (2013.01); *G11C 16/10* (2013.01); *G11C 16/26* (2013.01)

(58) Field of Classification Search
CPC . G11C 16/3459; G11C 16/0483; G11C 16/10; G11C 11/1677; G11C 11/2277
See application file for complete search history.

(56) References Cited

U.S. PATENT DOCUMENTS

2008/0056007 A1* 3/2008 Kang .................. G11C 11/5628
365/185.03
2022/0189567 A1* 6/2022 Lee ...................... G11C 11/5671

FOREIGN PATENT DOCUMENTS

KR 1020160029215 A 3/2016
KR 1020200050705 A 5/2020

* cited by examiner

*Primary Examiner* — Han Yang
(74) *Attorney, Agent, or Firm* — William Park & Associates Ltd.

(57) ABSTRACT

A semiconductor memory apparatus includes: a page buffer circuit, a pass/fail determination circuit, and an operation control circuit. The page buffer circuit may include a sensing latch circuit and a data latch circuit. The pass/fail determination circuit determines a pass/fail for a memory cell. The operation control circuit controls a program operation and a program verify operation to be performed on the memory cell.

15 Claims, 4 Drawing Sheets

SEMICONDUCTOR MEMORY APPARATUS AND OPERATING METHOD THEREOF

CROSS-REFERENCES TO RELATED APPLICATION

The present application claims priority under 35 U.S.C. § 119(a) to Korean application number 10-2022-0029342, filed on Mar. 8, 2022, which is incorporated herein by reference in its entirety.

BACKGROUND

1. Technical Field

Various embodiments generally relate to a semiconductor memory apparatus and an operating method thereof, and more particularly, to a semiconductor memory apparatus capable of performing a program verify operation on a plurality of memory cells, and an operating method thereof.

2. Related Art

In general, a semiconductor memory apparatus is classified into a volatile memory device and a non-volatile memory device. The volatile memory device and the non-volatile memory device may perform a data processing operation of receiving power and storing data therein or outputting data stored therein. The volatile memory device has a high data processing speed but needs to continuously receive power in order to retain data stored therein. Furthermore, the non-volatile memory device does not need to continuously receive power in order to retain data stored therein but has a low data processing speed.

Recently, the remarkable development in process and design technology for semiconductor memory apparatuses has significantly reduced the difference in data processing speed between the volatile memory device and the non-volatile memory device. Therefore, much attention has recently paid to the non-volatile memory device which is free from power required for retaining data stored therein.

Representative examples of the nonvolatile memory device may include a NAND-type flash memory device having a string structure in which a plurality of memory cells are coupled in series. The memory cells of the NAND-type flash memory device each include a floating gate. Therefore, the memory cell may store logic 'high' data or logic 'low' data by injecting or emitting electrons into or from the floating gate through the Fowler-Nordheim tunneling method.

The non-volatile memory device including a NAND-type flash memory device performs a program operation to store data in a memory cell and performs a read operation to output data stored in a memory cell. Furthermore, the non-volatile memory device performs an erase operation to erase data stored in a memory cell before the program operation. In particular, the program operation accompanies a verify operation. A verify operation refers to an operation of verifying whether desired data is accurately stored in a memory cell by the program operation. Hereafter, for convenience of description, the verify operation that is performed during the program operation is referred to as a 'program verify operation'.

When a memory cell is significantly degraded, the memory cell does not store data therein anymore. Therefore, the volatile memory device performs a pass/fail check operation to detect whether a plurality of memory cells are each a pass or fail and controls a circuit operation according to the detection result.

SUMMARY

In an embodiment, a semiconductor memory apparatus may include: a page buffer circuit comprising: a sensing latch circuit configured to, during a program verify operation, sense data, that is programmed in a memory cell through a program operation based on a pre-verify voltage and a final verify voltage; and a data latch circuit configured to store a program verify result that corresponds to the pre-verify voltage, wherein the pre-verify voltage has a lower voltage level than the final verify voltage; a pass/fail determination circuit configured to determine a pass/fail for the memory cell based on the program verify result; and an operation control circuit configured to control the program operation and the program verify operation based on the pass/fail determination result.

In an embodiment, an operating method of a semiconductor memory apparatus may include the steps of: performing a program operation on a memory cell; performing a program pre-verify operation on the memory cell; updating a data latch circuit based on a program verify result from the program pre-verify operation; determining a pass/fail for the memory cell based on the program verify result that is stored in the data latch circuit; and skipping a subsequent program verify operation on the memory cell and ending the program operation based on the result of the step of determining the pass/fail.

DETAILED DESCRIPTION

The description of the present disclosure is an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments are directed to a semiconductor memory apparatus capable of minimizing a program verify operation, and an operating method thereof.

In accordance with the present embodiments, the semiconductor memory apparatus and the operation method thereof may minimize a program verify operation, thereby reducing the overall program operation time.

Figure 1:
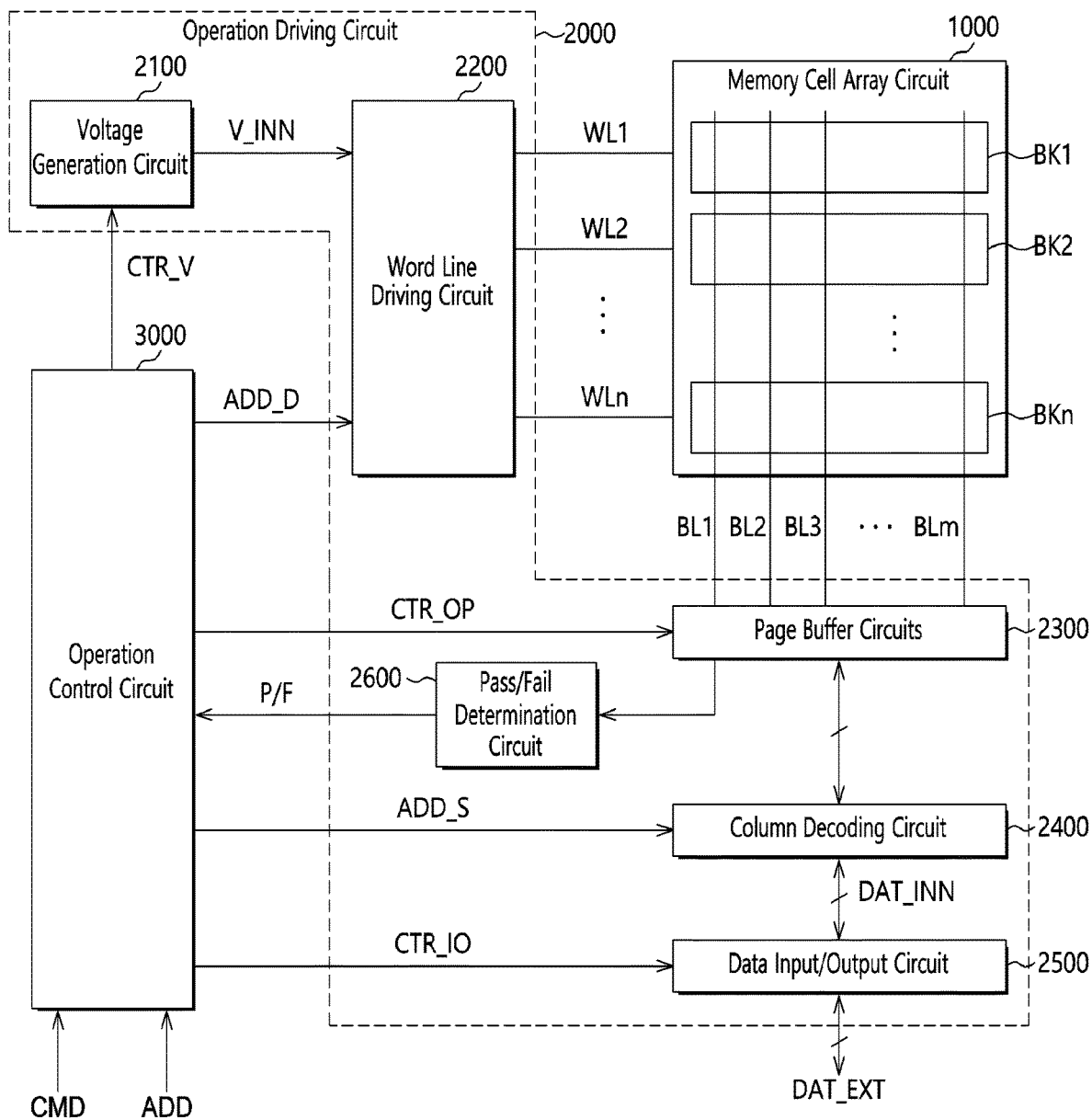
FIG. 1 is a block diagram illustrating the configuration of a semiconductor memory apparatus in accordance with an embodiment.

FIG. 1 is a block diagram illustrating the configuration of a semiconductor memory apparatus in accordance with an embodiment.

Referring to FIG. 1, the semiconductor memory apparatus may include a memory cell array circuit 1000, an operation driving circuit 2000, and an operation control circuit 3000.

The memory cell array circuit 1000 may be configured to store data. The memory cell array circuit 1000 may include a plurality of memory block circuits BK1 to BKn, where n is a natural number. The plurality of memory block circuits BK1 to BKn may each include a plurality of memory cells for storing data. The plurality of memory cells may have a string structure in which the memory cells are coupled in series in the vertical direction. The plurality of memory cells may be coupled to a plurality of word lines WL1 to WLn and a plurality of bit lines BL1 to BLm, respectively, where m is a natural number, and thus have a matrix structure. Although it will be described below, the plurality of word lines WL1 to WLn may be driven to a preset voltage according to a program operation, a read operation, an erase operation, or a verify operation by a word line driving circuit 2200. The plurality of bit lines BL1 to BLm may be driven to a preset voltage according to data that is stored in a memory cell or data to be stored in the memory cell.

The operation driving circuit 2000 may be driven to perform a program operation, a read operation, an erase operation, or a verify operation on a selected memory cell of the memory cell array circuit 1000. The operation driving circuit 2000 may include a voltage generation circuit 2100, the word line driving circuit 2200, a plurality of page buffer circuits 2300, a column decoding circuit 2400, a data input/output circuit 2500, and a pass/fail determination circuit 2600. Hereafter, the components that are included in the operation driving circuit 2000 will be described in detail.

The voltage generation circuit 2100 may be configured to generate an internal voltage V_INN that is required for each of the program operation, the read operation, the erase operation, and the verify operation. The voltage generation circuit 2100 may generate the internal voltages V_INN having various voltage levels that correspond to the respective operations based on a voltage control signal CTR_V that is generated by the operation control circuit 3000. The word line driving circuit 2200 may be configured to selectively drive the plurality of word lines WL1 to WLn to the internal voltage V_INN that is generated by the voltage generation circuit 2100. The word line driving circuit 2200 may receive the internal voltage V_INN from the voltage generation circuit 2100 and may receive a driving address signal ADD_D from the operation control circuit 3000. The driving address signal ADD_D may be a signal for selectively enabling the corresponding word line, among the plurality of word lines WL1 to WLn. Therefore, the word line driving circuit 2200 may selectively enable the plurality of word lines WL1 to WLn and may drive the enabled word line to the corresponding internal voltage V_INN based on the driving address signal ADD_D and the internal voltage V_INN.

Although not illustrated in the drawing, the word line driving circuit 2200 may also be coupled to a drain select line, a source select line, and a common source line, which are included in the memory cell array circuit 1000. Therefore, the word line driving circuit 2200 may drive each of the drain select line, the source select line, and the common source line to the preset internal voltage V_INN according to the program operation, the read operation, the erase operation, or the verify operation.

As described above, the plurality of memory cells may be coupled to the plurality of word lines WL1 to WLn, respectively. A word line, coupled to a memory cell, selected during the program operation, the read operation, the erase operation, or the verify operation may be driven by the corresponding internal voltage V_INN. Hereafter, for convenience of description, a memory cell that is selected during the program operation, the read operation, the erase operation, or the verify operation will be defined as a 'selected memory cell,' and a word line that is coupled to the selected memory cell will be defined as a 'selected word line.' Furthermore, memory cells, other than the selected memory cell, will be defined as 'unselected memory cells,' and word lines that are coupled to the unselected memory cells will be defined as 'unselected word lines.' In other words, a selected word line that is coupled to a selected memory cell during the program operation, the read operation, the erase operation, or the verify operation may be driven by the corresponding internal voltage V_INN.

For example, during the program operation, the word line driving circuit 2200 may apply a program voltage as one of the internal voltages V_INN to the selected word line among the plurality of word lines WL1 to WLn and may apply a program pass voltage to the other unselected word lines, the program pass voltage having a lower voltage level than the program voltage. Furthermore, during the read operation, the word line driving circuit 2200 may apply a read voltage to the selected word line and may apply a read pass voltage to the unselected word lines, the read pass voltage having a higher voltage level than the read voltage. Furthermore, during the erase operation, the word line driving circuit 2200 may apply a ground voltage to the selected word line. Furthermore, during the verify operation, the word line driving circuit 2200 may apply a verify voltage as one of the internal voltages V_INN to the selected word line and may apply a verify pass voltage to the unselected word lines, the verify pass voltage having a higher voltage level than the verify voltage.

The plurality of page buffer circuits 2300 may be coupled to the memory cell array circuit 1000 through the plurality of bit lines BL1 to BLm. The plurality of page buffer circuit 2300 may be configured to transfer data to the plurality of bit lines BL1 to BLm during the program operation. Furthermore, the plurality of page buffer circuits 2300 may be configured to receive data from the plurality of bit lines BL1 to BLm during the read operation and the verify operation. The plurality of page buffer circuits 2300 may be configured as a plurality of latch circuits, respectively. The plurality of latch circuits may each perform a circuit operation based on the program operation, the read operation, or the verify operation on input/output data, based on an operation control signal CTR_OP that is generated by the operation control circuit 3000.

The column decoding circuit 2400 may be configured to control a transfer path of input/output data. The column decoding circuit 2400 may receive data to be output to an external device, from the plurality of page buffer circuits 2300 and may receive data to be input to devices within the semiconductor memory apparatus from the data input/output circuit 2500. Furthermore, the column decoding circuit 2400 may receive a select address signal ADD_S from the operation control circuit 3000 and may control the transfer path of input/output data. The select address signal ADD_S may be a signal for selecting the corresponding bit line, among the plurality of bit lines BL1 to BLm.

The data input/output circuit 2500 may be configured to control the input/output of an internal data signal DAT_INN and an external data signal DATA_EXT. The internal data signal DAT_INN may include data that is input/output inside the semiconductor memory apparatus. The external data signal DAT_EXT may include data that is input/output outside of the semiconductor memory apparatus. The data input/output circuit 2500 may perform a data input/output operation based on an input/output control signal CTR_IO that is generated by the operation control circuit 3000. For example, during the program operation, the data input/output circuit 2500 may output the external data DAT_EXT that is received from a host device or a control device as the internal data DAT_INN based on the input/output control signal CTR_IO. Furthermore, during the read operation, the data input/output circuit 2500 may output the internal data DAT_INN that is received from the column decoding circuit 2400 as the external data DAT_EXT based on the input/output control signal CTR_IO.

The pass/fail determination circuit 2600 may be configured to decide a pass/fail for a memory cell of the memory cell array circuit 1000 based on a program verify result for data that is programmed in the memory cell array circuit 1000. The pass/fail determination circuit 2600 may generate a pass/fail result signal P/F that corresponds to the program verify result. The pass/fail determination circuit 2600 may transfer the pass/fail result signal P/F to the operation control circuit 3000.

The operation control circuit 3000 may be configured to control the voltage generation circuit 2100, the word line driving circuit 2200, the plurality of page buffer circuits 2300, the column decoding circuit 2400, the data input/output circuit 2500, and the pass/fail determination circuit 2600, which are included in the operation driving circuit 2000. For example, the operation control circuit 3000 may generate a voltage control signal CTR_V for controlling the voltage generation circuit 2100 based on a command signal CMD and an address signal ADD that are input through the host device or the control device. Furthermore, the operation control circuit 3000 may generate the driving address signal ADD_D that is provided to the word line driving circuit 2200, the operation control signal CTR_OP for controlling the plurality of page buffer circuits 2300, the select address signal ADD_S for controlling the column decoding circuit 2400, and the input/output control signal CTR_IO for controlling the data input/output circuit 2500. The operation control circuit 3000 may generate various signals to control the overall operations of the semiconductor memory apparatus. Furthermore, the operation control circuit 3000 may control the program operation and the program verify operation based on the pass/fail result signal P/F that is provided by the pass/fail determination circuit 2600.

Figure 2:
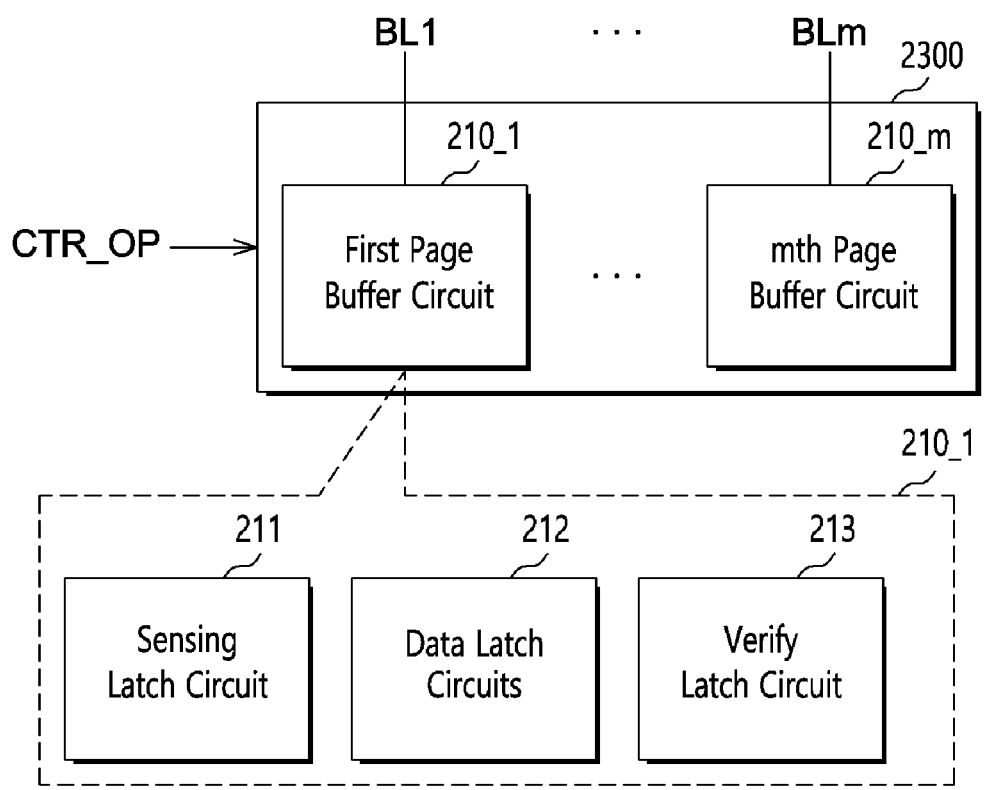
FIG. 2 is a block diagram illustrating some of internal components of a plurality of page buffer circuits of FIG. 1.

FIG. 2 is a block diagram illustrating some of internal components of the plurality of page buffer circuits 2300 of FIG. 1.

Referring to FIG. 2, the plurality of page buffer circuits 2300 may be configured to store data according to a program operation, a read operation, and a verify operation, based on the operation control signal CTR_OP. The plurality of page buffer circuits 2300 may include first to $m^{th}$ page buffer circuits 210_1 to 210_m that are coupled to the plurality of bit lines BL1 to BLm, respectively. Hereafter, for convenience of description, the first page buffer circuit 210_1, among the first to $m^{th}$ page buffer circuits 210_1 to 210_m, coupled to the first bit line BL1, will be representatively described.

The first page buffer circuit 210_1 may be coupled to the first bit line BL1 and may be configured to store data that corresponds to the program operation, the read operation, or the verify operation. The first page buffer circuit 210_1 may include a sensing latch circuit 211 and a plurality of data latch circuits 212. Hereafter, for convenience of description, the program verify operation, among various operations of the semiconductor memory apparatus, will be representatively described.

The sensing latch circuit 211 may be configured to store data that is transferred through the first bit line BL during the program verify operation. The sensing latch circuit 211 may retain data that is stored therein or invert the data and store the inverted data, depending on the data that is transferred through the first bit line BL1. The program verify operation may include a program pre-verify operation and a program final verify operation. Therefore, the sensing latch circuit 211 may sense data based on a pre-verify voltage during the program pre-verify operation and may sense data based on a final verify voltage during the program final verify operation. The pre-verify voltage may have a lower voltage level than the final verify voltage.

The plurality of data latch circuits 212 may be configured to store a program verify result during the program verify operation. The semiconductor memory apparatus, in accordance with the present embodiment, may store a program verify result that corresponds to the pre-verify voltage in one or more data latch circuits of the plurality of data latch circuits 212. Although will be described again below, the operation control circuit 3000 of FIG. 1 may control the program operation and the program verify operation based on the program verify result that is stored in the plurality of data latch circuits 212. In short, the operation control circuit 3000 may skip the program verify operation on a memory cell that has been determined as a pass in response to the pre-verify voltage. Therefore, the semiconductor memory apparatus may minimize the program verify operation, thereby reducing the overall program operation time.

The plurality of data latch circuits 212 may be configured to store the program verify result that corresponds to the final verify voltage and the pre-verify voltage. The number of data latch circuits 212 may be designed differently depending on the number of data distributions that are stored in a memory cell.

For reference, the memory cells of a non-volatile memory device are defined as a single level cell, a multi-level cell, a triple level cell, a quadruple level cell and the like, depending on the number of data distributions that are stored in one memory cell during the program operation. The single level cell has two data distributions that correspond to logic 'high' data or logic 'low' data in response to one bit. The multi-level cell has four data distributions that correspond to two bits, the triple level cell has eight data distributions that correspond to three bits, and the quadruple level cell has 16 data distributions that correspond to four bits. Therefore, when the number of data distributions stored in the memory cell is eight, three data latch circuits 212 may be provided.

The first page buffer circuit 210_1 may include a verify latch circuit 213.

The verify latch circuit 213 may be configured to store a program verify result that corresponds to the pre-verify voltage and the final verify voltage during the program verify operation. As described above, the plurality of data latch circuits 212 may store the program verify result during the program verify operation. At this time, the verify latch circuit 213 may store the program verify result before the corresponding program verify result is stored in the plurality of data latch circuits 212. The verify latch circuit 213 may receive the program verify result from the sensing latch circuit 211. Furthermore, the verify latch circuit 213 may receive the program verify result through a sensing node SO (see FIG. 3), which will be described below, without using the sensing latch circuit 211. In other words, the program verify result that corresponds to the pre-verify voltage and the final verify voltage may be stored in the verify latch circuit 213 during the program verify operation. The verify latch circuit 213 may transfer the stored program verify result to the plurality of data latch circuits 212 and may update the plurality of data latch circuits 212 according to the program verify result.

The semiconductor memory apparatus, in accordance with the present embodiment, may use the verify latch circuit 213 to update the program verify result that corresponds to the pre-verify voltage in the plurality of data latch circuits 212.

Figure 3:
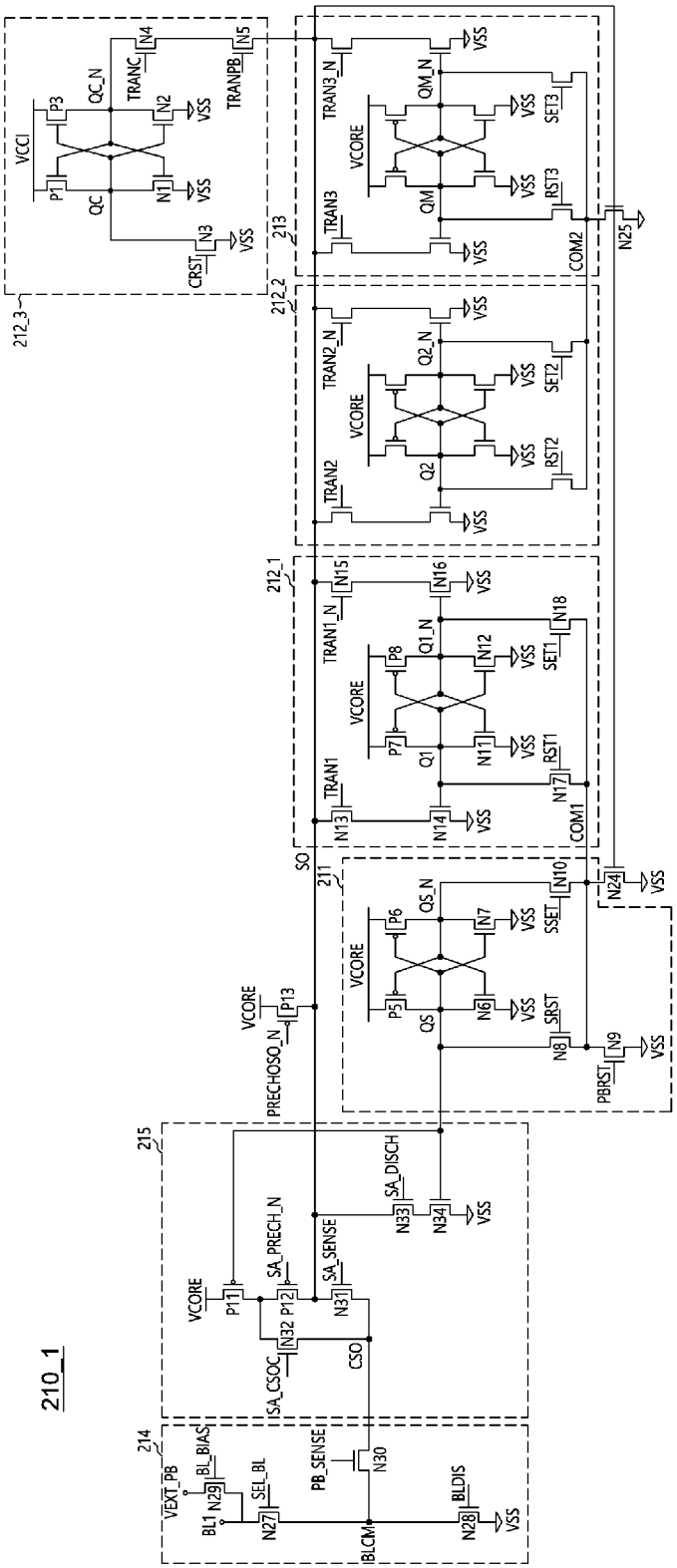
FIG. 3 is a circuit diagram illustrating the circuit configuration of a first page buffer circuit of FIG. 2.

FIG. 3 is a circuit diagram illustrating the circuit configuration of the first page buffer circuit 210_1 of FIG. 2. For convenience of description, the case in which three data latch circuits 212 are provided will be taken as an example. In other words, the plurality of data latch circuits 212 may include first to third data latch circuits 212_1 to 212_3.

Referring to FIG. 3, the first page buffer circuit 210_1 may include the sensing latch circuit 211, the first to third data latch circuits 212_1 to 212_3 that serve as the plurality of data latch circuits, the verify latch circuit 213, a bit line coupling circuit 214, and a data sensing circuit 215. Before description, the first page buffer circuit 210_1 may be controlled based on the operation control signal CTR_OP that is generated by the operation control circuit 3000 of FIG. 1. In other words, the plurality of control signals for controlling the first page buffer circuit 210_1 may be included in the operation control signal CTR_OP.

The sensing latch circuit 211 may be configured to sense and store data transferred through the first bit line BL1. The sensing latch circuit 211 may store data that is transferred through the first bit line BL1 based on a sensing reset signal SRST and a sensing set signal SSET.

More specifically, the sensing latch circuit 211 may include a fifth PMOS transistor P5 and a sixth NMOS transistor N6 that are coupled in series between a core voltage terminal VCORE and a ground voltage terminal VSS. The sensing latch circuit 211 may include a sixth PMOS transistor P6 and a seventh NMOS transistor N7 that are coupled in series between the core voltage terminal VCORE and the ground voltage terminal VSS. Gates of the fifth PMOS transistor P5 and the sixth NMOS transistor N6 may be coupled to a secondary sensing node QS_N in common that is coupled to the sixth PMOS transistor P6 and the seventh NMOS transistor N7 in common. Gates of the sixth PMOS transistor P6 and the seventh NMOS transistor N7 may be coupled to a primary sensing node QS in common that is coupled to the fifth PMOS transistor P5 and the sixth NMOS transistor N6 in common.

The sensing latch circuit 211 may include an eighth NMOS transistor N8 and a ninth NMOS transistor N9 that are coupled in series between the primary sensing node QS and the ground voltage terminal VSS. The eighth NMOS transistor N8 may receive the sensing reset signal SRST through a gate thereof, and the ninth NMOS transistor N9 may receive a page reset signal PBRST through a gate thereof. The sensing latch circuit 211 may include a tenth NMOS transistor N10 between the secondary sensing node QS_N and a first common node COM1. The tenth NMOS transistor N10 may receive the sensing set signal SSET through a gate thereof. Therefore, the sensing latch circuit 211 may temporarily store program verify data that corresponds to the program verify result based on the sensing reset signal SRST and the sensing set signal SSET during the program verify operation.

The first to third data latch circuits 212_1 to 212_3 may be configured to store the program verify data that is transferred from the sensing latch circuit 211. The first to third data latch circuits 212_1 to 212_3 may be coupled to the sensing node SO in common.

For reference, the first data latch circuit 212_1 may store program verify data that corresponds to the MSB (Most Significant Bit), the second data latch circuit 212_2 may store program verify data that corresponds to the CSB (Central Significant Bit), and the third data latch circuit 212_3 may store program verify data that corresponds to the LSB (Least Significant Bit). The third data latch circuit 212_3 may serve as a cache depending on an operation situation.

In other words, during the read operation, the third data latch circuit 212_3 may store data that is stored in the first data latch circuit 212_1, the second data latch circuit 212_2, and the verify latch circuit 213, and transfer the stored data to the column decoding circuit 2400 (see FIG. 1). Furthermore, during the program operation, the third data latch circuit 212_3 may store data to be stored in a selected memory cell and may transfer the stored data to the sensing node SO. Furthermore, during the program verify operation, the third data latch circuit 212_3 may receive program verify data stored in the first data latch circuit 212_1 and the second data latch circuit 212_2, store the received data therein, and output the stored data to the pass/fail determination circuit 2600 (see FIG. 1).

The first data latch circuit 212_1 may include a seventh PMOS transistor P7 and an 11th NMOS transistor N11 that are coupled in series between the core voltage terminal VCORE and the ground voltage terminal VSS. The first data latch circuit 212_1 may include an eighth PMOS transistor P8 and a 12th NMOS transistor N12 that are coupled in series between the core voltage terminal VCORE and the ground voltage terminal VSS. Gates of the seventh PMOS transistor P7 and the 11th NMOS transistor N11 may be coupled to a first secondary data node Q1_N in common. Gates of the eighth PMOS transistor P8 and the 12th NMOS transistor N12 may be coupled to a first primary data node Q1 in common.

The first data latch circuit 212_1 may include a 13th NMOS transistor N13 and a 14th NMOS transistor N14 that are coupled in series between the sensing node SO and the ground voltage terminal VSS. The 13th NMOS transistor N13 may receive a first primary data transfer signal TRAN1 through a gate thereof, and the 14th NMOS transistor N14 may have a gate that is coupled to the first primary data node Q1. The first data latch circuit 212_1 may include a 15th NMOS transistor N15 and a 16th NMOS transistor N16 that are coupled in series between the sensing node SO and the ground voltage terminal VSS. The 15th NMOS transistor N15 may receive a first secondary data transfer signal TRAN1_N through a gate thereof, and the 16th NMOS transistor N16 may have a gate coupled to the first secondary data node Q1_N.

The first data latch circuit 212_1 may include a 17th NMOS transistor N17 that is coupled between the first primary data node Q1 and the first common node COM1. The 17th NMOS transistor N17 may receive a first data reset signal RST1 through a gate thereof. The first data latch circuit 212_1 may include an 18th NMOS transistor N18 that is coupled between the first secondary data node Q1_N and the first common node COM1. The 18th NMOS transistor N18 may receive a first data set signal SET1 through a gate thereof.

Therefore, the first data latch circuit 212_1 may store the program verify data transferred from the sensing latch circuit 211 based on the first primary/secondary data transfer signals TRAN1 and TRAN1_N and the first data reset/set signals RST1 and SET1.

Since the first data latch circuit 212_1, the second data latch circuit 212_2, and the verify latch circuit 213 have similar circuit configurations to one another, except for the control signals input thereto, the detailed descriptions of the second data latch circuit 212_2 and the verify latch circuit 213 will be omitted herein. However, the second data latch circuit 212_2 may have second primary/secondary data nodes Q2 and Q2_N that are formed therein and may store the program verify data based on second primary/secondary data transfer signals TRAN2 and TRAN2_N and second data reset/set signals RST2 and SET2. The verify latch circuit 213 may have primary/secondary verify nodes QM and QM_N formed therein and may store the program verify data transferred from the sensing latch circuit 211 based on third primary/secondary data transfer signals TRAN3 and TRAN3_N and third data reset/set signals RST3 and SET3.

Between the ground voltage terminal VSS and the first common node COM1 that are coupled to the sensing latch circuit 211 and the first data latch circuit 212_1 in common, a 24th NMOS transistor N24 may be coupled. Between the ground voltage terminal VSS and a second common node COM2 that are coupled to the second data latch circuit 212_2 and the verify latch circuit 213 in common, a 25th NMOS transistor N25 may be coupled. Gates of the 24th and 25th NMOS transistors N24 and N25 may be coupled to the sensing node SO. Therefore, the 24th and 25th NMOS transistors N24 and N25 may form a current path that is coupled to the ground voltage terminal VSS based on the voltage level of the sensing node SO.

As described above, the third data latch circuit 212_3 may serve as a cache depending on an operation situation. The third data latch circuit 212_3 may include a first PMOS transistor P1 and a first NMOS transistor N1 that are coupled in series between a power supply voltage terminal VCCI and the ground voltage terminal VSS. The third data latch circuit 212_3 may include a third PMOS transistor P3 and a second NMOS transistor N2 that are coupled in series between the power supply voltage terminal VCCI and the ground voltage terminal VSS. Gates of the first PMOS transistor P1 and the first NMOS transistor N1 may be coupled to a secondary caching node QC_N in common. Gates of the third PMOS transistor P3 and the second NMOS transistor N2 may be coupled to a primary caching node QC in common.

The third data latch circuit 212_3 may include a third NMOS transistor N3 between the primary caching node QC and the ground voltage terminal VSS. The third NMOS transistor N3 may receive a caching reset signal CRST through a gate thereof. Therefore, the third data latch circuit 212_3 may perform a reset operation on the primary caching node QC based on the caching reset signal CRST. The third data latch circuit 212_3 may include a fourth NMOS transistor N4 and a fifth NMOS transistor N5 that are coupled in series between the secondary caching node QC_N and the ground voltage terminal VSS. The fourth NMOS transistor N4 may receive a first caching transfer signal TRANC through a gate thereof, and the fifth NMOS transistor N5 may receive a second caching transfer signal TRANPB through a gate thereof. Therefore, the third data latch circuit 212_3 may store the program verify data that is transferred through the sensing node SO based on the first and second caching transfer signals TRANC and TRANPB.

The bit line coupling circuit 214 may be configured to couple the first bit line BL1 and a current sensing node CSO. The bit line coupling circuit 214 may couple the first bit line BL1 to the current sensing node CSO based on a bit line select signal SEL_BL such that data that is transferred through the first bit line BL1 can be transferred to the current sensing node CSO.

More specifically, the bit line coupling circuit 214 may include a 27th NMOS transistor N27 and a 28th NMOS transistor N28 that are coupled in series between the first bit line BL1 and the ground voltage terminal VSS. The 27th NMOS transistor N27 may receive the bit line select signal SEL_BL through a gate thereof, and the 28th NMOS transistor N28 may receive a bit line discharge signal BLDIS through a gate thereof.

The bit line coupling circuit 214 may include a 29th NMOS transistor N29 that is coupled between a buffer voltage terminal VEXT_PB and the first bit line BL1. The 29th NMOS transistor N29 may receive an erase control voltage BL_BIAS through a gate thereof. The bit line coupling circuit 214 may include a 30th NMOS transistor N30 that is coupled between the current sensing node CSO and a common node BLCM between the 27th NMOS transistor N27 and the 28th NMOS transistor N28. The 30th NMOS transistor N30 may receive a bit line sensing signal PB_SENSE through a gate thereof.

Therefore, the bit line coupling circuit 214 may transfer data, transferred through the first bit line BL1, to the current sensing node CSO based on the bit line select signal SEL_BL and the bit line sensing signal PB_SENSE.

The data sensing circuit 215 may be configured to couple the current sensing node CSO and the sensing node SO. The data sensing circuit 215 may couple the current sensing node CSO to the sensing node SO based on a sensing control signal SA_SENSE such that the data that is transferred through the first bit line BL1 can be transferred to the sensing node SO.

More specifically, the data sensing circuit 215 may include an 11th PMOS transistor P11, a 12th PMOS transistor P12, and a 31st NMOS transistor N31, which are coupled in series between the core voltage terminal VCORE and the current sensing node CSO. The 11th PMOS transistor P11 may have a gate that is coupled to the primary sensing node QS, the 12th PMOS transistor P12 may receive a precharge control signal SA_PRECH_N through a gate thereof, and the 31st NMOS transistor N31 may receive the sensing control signal SA_SENSE through a gate thereof. The data sensing circuit 215 may include a 32nd NMOS transistor N32 between a drain of the 11th PMOS transistor P11 and the current sensing node CSO. The 32nd NMOS transistor N32 may receive a sense amp coupling signal SA_CSOC through a gate thereof.

The data sensing circuit 215 may include a 33rd NMOS transistor N33 and a 34th NMOS transistor N34 that are coupled in series between the sensing node SO and the ground voltage terminal VSS. The 33rd NMOS transistor N33 may receive a sense amp discharge signal SA_DISCH through a gate thereof, and the 34th NMOS transistor N34 may have a gate that is coupled to the primary sensing node QS.

Therefore, the data sensing circuit 215 may transfer data, transferred through the current sensing node CSO, to the sensing node SO based on the sensing control signal SA_SENSE and the sense amp coupling signal SA_CSOC.

The first page buffer circuit 210_1 may transfer data, transferred through the first bit line BL1, to the sensing node SO through the bit line coupling circuit 214 and the data sensing circuit 215. For reference, the bit line coupling circuit 214 and the data sensing circuit 215 may be defined as a 'data transfer circuit' that transfers data that is stored in a memory cell to the sensing node SO.

The first page buffer circuit 210_1 may include a 13th PMOS transistor P13 for precharging the sensing node SO. The 13th PMOS transistor P13 may be coupled between the core voltage terminal VCORE and the sensing node SO and may receive a precharge signal PRECHSO_N through a gate thereof. Therefore, the 13th PMOS transistor P13 may precharge the sensing node SO with a voltage level that corresponds to the core voltage terminal VCORE based on the precharge signal PRECHSO_N.

The semiconductor memory apparatus, in accordance with the present embodiment, may update the program verify result in the plurality of data latch circuits 212 through the verify latch circuit 213 during the program verify operation or specifically the pre-program verify operation. Furthermore, the pass/fail determination circuit 2600 (see FIG. 1) may generate the pass/fail result signal P/F for a corresponding memory cell based on the program verify results that are stored in the plurality of data latch circuits 212.

Figure 4:
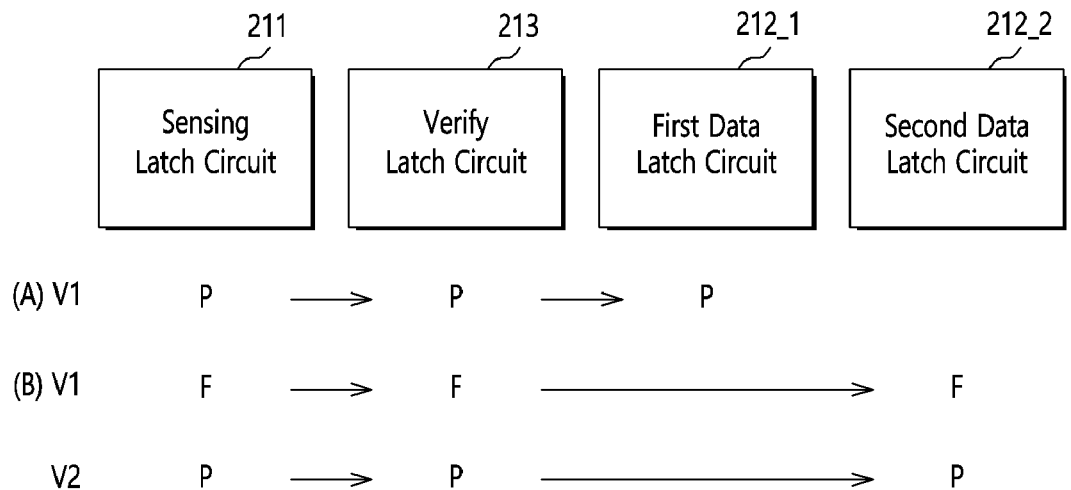
FIG. 4 is a diagram illustrating a schematic operation of the first page buffer circuit of FIGS. 2 and 3.

FIG. 4 is a diagram illustrating a schematic operation of the first page buffer circuit 210_1 of FIGS. 2 and 3. For convenience of description, the case in which the number of data distributions that are stored in a memory cell is two will be taken as the example. In other words, the plurality of data latch circuits 212 of FIG. 2 may include two data latch circuits (i.e., the first data latch circuit 212_1 and the second data latch circuit 212_2). In FIG. 4, the pre-verify voltage is represented by 'V1', and the final verify voltage is represented by 'V2'. As described above, the pre-verify voltage V1 may have a lower voltage level than the final verify voltage V2.

In FIG. 4, case (A) may correspond to the program pre-verify operation.

Case (A) may indicate that data that is programmed in a memory cell is formed at a voltage level higher than the pre-verify voltage V1 lower than the final verify voltage V2. Therefore, the sensing latch circuit 211 may store a program verify result that corresponds to a pass P based on the pre-verify voltage V1. The verify latch circuit 213 may receive the program verify result that corresponds to a pass P and may store the received program verify result. The verify latch circuit 213 may transfer the program verify result to the first data latch circuit 212_1, for example. Then, the pass/fail determination circuit 2600 (see FIG. 1) may generate the pass/fail result signal P/F that corresponds to a pass P. Furthermore, the operation control circuit 3000 (see FIG. 1) may apply a preset program pulse to the corresponding memory cell based on the pass/fail result signal P/F. Then, the operation control circuit 3000 may skip a subsequent program verify operation on the corresponding memory cell.

The semiconductor memory apparatus in accordance with the embodiment may generate the pass/fail result P/F that corresponds to a pass P through the program pre-verify operation on a memory cell having data that is formed at a voltage level higher than the pre-verify voltage V1 and lower than the final verify voltage V2. The semiconductor memory apparatus may skip a subsequent program verify operation on the memory cell that has been determined as a pass. Therefore, the semiconductor memory apparatus may reduce the overall program operation time by as much as the time it takes to perform the skipped program verify operation.

In FIG. 4, case (B) may correspond to the program final verify operation. The program final verify operation may include the program pre-verify operation that corresponds to case (A).

Case (B) may indicate that data that is programmed in a memory cell is formed at a lower voltage level than the pre-verify voltage V1. Therefore, the sensing latch circuit 211 may store a program verify result that corresponds to a fail F based on the pre-verify voltage V1 through the program pre-verify operation. The verify latch circuit 213 may receive the program verify result that corresponds to the fail F and may transfer the received program verify result to the second data latch circuit 212_2, for example. Then, the pass/fail determination circuit 2600 (see FIG. 1) may generate the pass/fail result signal P/F that corresponds to the fail F. The operation control circuit 3000 (see FIG. 1) may apply a preset program pulse to the corresponding memory cell based on a pass voltage V_PASS.

The corresponding memory cell may have data that is formed at a higher voltage level than the final verify voltage V2 according to the preset program pulse. Therefore, the sensing latch circuit 211 may store the program verify result that corresponds to a pass P based on the final verify voltage V2 through the program final verify operation. The second data latch circuit 212_2 may store the program verify result that corresponds to a pass P, which has been transferred through the verify latch circuit 213. Then, the pass/fail determination circuit 2600 (see FIG. 1) may generate the pass/fail result signal P/F that corresponds to a pass P. The operation control circuit 3000 (see FIG. 1) may apply the preset program pulse to the corresponding memory cell based on the pass voltage V_PASS.

The semiconductor memory apparatus may complete the program operation through the program pre-verify operation (A) and the program final verify operation (B). As described above, the semiconductor memory apparatus may skip a subsequent program verify operation on the memory cell that is determined as a pass P during the program pre-verify operation (A). Therefore, the semiconductor memory apparatus may decrease the program completion time by as much as time it takes to perform the skipped program verify operation.

In FIG. 4, the case in which the verify latch circuit 213 is used to store the program verify result in the first and second data latch circuits 212_1 and 212_2 has been taken as an example. However, the semiconductor memory apparatus in accordance with the present embodiment may receive the program verify result through the sensing node SO of FIG. 3 without using the verify latch circuit 213, when storing the program verify result in the first and second data latch circuits 212_1 and 212_2. At this time, the program verify result that is stored in the sensing latch circuit 211 may have been transferred to the sensing node SO.

Figure 5:
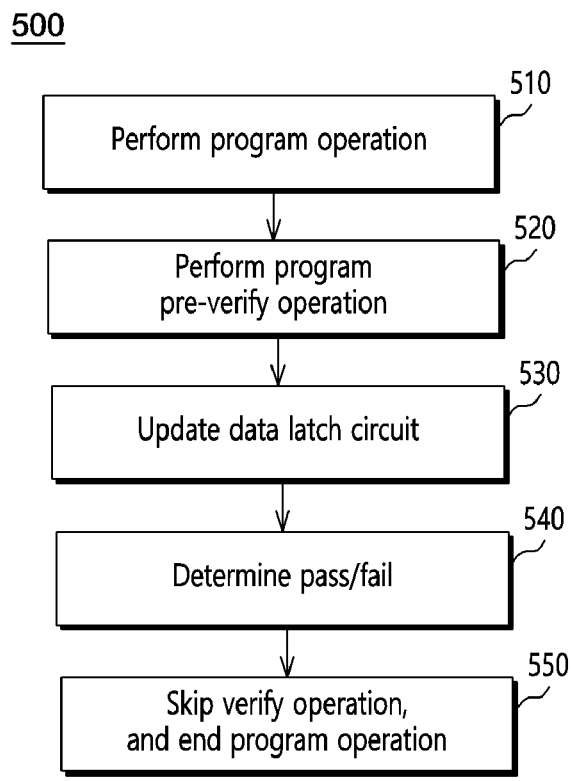
FIG. 5 is a flowchart illustrating an operating method of the semiconductor memory apparatus of FIG. 1.

FIG. 5 is a flowchart illustrating an operating method 500 of the semiconductor memory apparatus of FIG. 1.

Referring to FIG. 5, the operating method 500 of the semiconductor memory apparatus may include step 510 of performing a program operation, step 520 of performing a program pre-verify operation, step 530 of updating a data latch circuit, step 540 of determining a pass/fail, and step 550 of skipping a program verify operation and ending the program operation.

Step 510 of performing the program operation may include performing a program operation on a memory cell. Step 510 of performing the program operation may be performed by the operation driving circuit 2000 that is controlled by the operation control circuit 3000 of FIG. 1. The operation driving circuit 2000 may perform a program operation for storing data in the respective memory cells that are included in the memory cell array circuit 1000.

Step 520 of performing the program pre-verify operation may include performing the program pre-verify operation on a memory cell. As described above with reference to FIG. 4, the semiconductor memory apparatus may perform the pre-verify operation on the memory cell by using the pre-verify voltage V1.

Step 530 of updating the data latch circuit may include updating the first data latch circuit 212_1, for example, based on the program verify result for the pre-verify operation. As described above with reference to FIG. 4, the first data latch circuit 212_1 may store the program verify result that corresponds to the pre-verify voltage V1. At this time, the first data latch circuit 212_1 may be updated by using the verify latch circuit 213. The first data latch circuit 212_1 may be updated by using the sensing node SO (see FIG. 3) without using the verify latch circuit 213.

Step 530 of updating the data latch circuit may be performed in a program operation period for memory cells other than the corresponding memory cell. For example, an update operation of the memory cell may be separated from the program operation of the memory cell, but an update period may be overlapped with the program operation period, thereby reducing the program operation time.

Step 540 of determining the pass/fail may include determining a pass/fail for the memory cell based on the program verify result that is stored in the first data latch circuit 212_1. Step 540 of determining the pass/fail may be performed by the pass/fail determination circuit 2600 of FIG. 1. The pass/fail determination circuit 2600 may determine a pass/fail for the memory cell based on the program verify result that is stored in the first data latch circuit 212_1.

Step 550 of skipping the program verify operation and ending the program operation may include skipping the program verify operation on the memory cell and ending the program operation based on the result of step 540 of determining the pass/fail. Step 550 of skipping the program verify operation and ending the program operation may be performed by the operation driving circuit 2000 that is controlled by the operation control circuit 3000 of FIG. 1. The operation driving circuit 2000 may apply a preset program pulse to the corresponding memory cell based on the pass/fail result signal P/F, and skip a subsequent program verify operation. The operation driving circuit 2000 may end the program operation on the corresponding memory cell.

The semiconductor memory apparatus, in accordance with the present embodiment, may update a program verify result in the data latch circuit through the pre-verify operation on a memory cell. Furthermore, the semiconductor memory apparatus may skip the program verify operation on the corresponding memory cell based on the updated program verify result, thereby reducing the program operation time.

While various embodiments have been described above, it will be understood to those skilled in the art that the embodiments described are examples only. Accordingly, the semiconductor memory apparatus and the operating method, which are described herein, should not be limited based on the described embodiments.

What is claimed is:

1. A semiconductor memory apparatus comprising:
   a page buffer circuit comprising:
      a sensing latch circuit configured to, during a program verify operation, sense data that is programmed in a memory cell through a program operation based on a pre-verify voltage and a final verify voltage; and
      a data latch circuit configured to store a program verify result that corresponds to the pre-verify voltage, wherein the pre-verify voltage has a lower voltage level than the final verify voltage;
   a pass/fail determination circuit configured to determine a pass/fail for the memory cell based on the program verify result; and
   an operation control circuit configured to control the program operation and the program verify operation based on the pass/fail determination result.

2. The semiconductor memory apparatus according to claim 1, wherein the operation control circuit is configured to apply a preset program pulse to the memory cell based on the pass/fail determination result that corresponds to the pre-verify voltage and then configured to skip a subsequent program verify operation.

3. The semiconductor memory apparatus according to claim 1, wherein the program verify operation comprises a program pre-verify operation that corresponds to the pre-verify voltage and a program final verify operation that corresponds to the final verify voltage.

4. The semiconductor memory apparatus according to claim 1, further comprising a verify latch circuit configured to, during the program verify operation, store the program verify result that corresponds to the pre-verify voltage and configured to transfer the program verify result to the data latch circuit to update the program verify result.

5. The semiconductor memory apparatus according to claim 1, further comprising a data transfer circuit configured to transfer the data, stored in the memory cell, to a sensing node that is coupled to the data latch circuit, wherein the data latch circuit is configured to receive the program verify result through the sensing node.

6. The semiconductor memory apparatus according to claim 1, wherein the data latch circuit comprises a plurality of data latch circuits that correspond to the number of data distributions that are stored in the memory cell, and
wherein the plurality of data latch circuits are configured to be coupled, in common, to a sensing node.

7. The semiconductor memory apparatus according to claim 1, further comprising a cache latch circuit configured to receive the program verify result that is stored in the data latch circuit during the program verify operation, store the received program verify result, and output the stored program verify result to the pass/fail determination circuit.

8. An operating method of a semiconductor memory apparatus, comprising the steps of:
performing a program operation on a memory cell;
performing a program pre-verify operation on the memory cell;
updating a data latch circuit based on a program verify result from the program pre-verify operation;
determining a pass/fail for the memory cell based on the program verify result that is stored in the data latch circuit; and
skipping a subsequent program verify operation on the memory cell and ending the program operation based on the result of the step of determining the pass/fail.

9. The operating method according to claim 8, further comprising the step of performing a program final verify operation on the memory cell.

10. The operating method according to claim 9, wherein the program final verify operation is performed based on a final verify voltage, and
wherein the program pre-verify operation is performed based on a pre-verify voltage, the pre-verify voltage having a lower voltage level than the final verify voltage.

11. The operating method according to claim 8, wherein the updating of the data latch circuit comprises the steps of:
storing the program verify result in a sensing latch circuit;
storing the program verify result, stored in the sensing latch circuit, in a verify latch circuit; and
storing the program verify result, stored in the verify latch circuit, in the data latch circuit.

12. The operating method according to claim 8, wherein the updating of the data latch circuit comprises the steps of:
storing the program verify result in a sensing latch circuit; and
storing the program verify result, stored in the sensing latch circuit, in the data latch circuit through a sensing node.

13. The operating method according to claim 8, wherein the step of updating the data latch circuit is performed in a program operation period for a memory cell other than the memory cell.

14. The operating method according to claim 8, further comprising the step of storing the program verify result in a cache latch circuit and providing the program verify result to the step of determining the pass/fail.

15. The operating method according to claim 8, wherein the step of skipping the subsequent program verify operation and ending the program operation comprises the steps of:
applying a preset program pulse to the memory cell;
skipping the subsequent program verify operation on the memory cell; and
ending the program operation on the memory cell.

* * * * *